(12) United States Patent
Tahara

(10) Patent No.: US 9,244,425 B2
(45) Date of Patent: Jan. 26, 2016

(54) IMAGE FORMING APPARATUS

(71) Applicant: KYOCERA DOCUMENT SOLUTIONS INC., Osaka-shi (JP)

(72) Inventor: Mitsuhiro Tahara, Osaka (JP)

(73) Assignee: KYOCERA DOCUMENT SOLUTIONS INC., Osaksa-Shi (JP)

( * ) Notice: Subject to any disclaimer, the term of this patent is extended or adjusted under 35 U.S.C. 154(b) by 0 days.

(21) Appl. No.: 14/386,559

(22) PCT Filed: Mar. 18, 2013

(86) PCT No.: PCT/JP2013/057726
§ 371 (c)(1),
(2) Date: Sep. 19, 2014

(87) PCT Pub. No.: WO2013/141219
PCT Pub. Date: Sep. 26, 2013

(65) Prior Publication Data
US 2015/0069895 A1    Mar. 12, 2015

(30) Foreign Application Priority Data

Mar. 21, 2012 (JP) .................................. 2012-063304

(51) Int. Cl.
*G03G 21/16* (2006.01)
*H05K 5/02* (2006.01)
*H05K 5/03* (2006.01)
*G03G 21/18* (2006.01)

(52) U.S. Cl.
CPC ........ *G03G 21/1619* (2013.01); *G03G 21/1633* (2013.01); *H05K 5/0217* (2013.01); *H05K 5/0221* (2013.01); *H05K 5/0239* (2013.01); *H05K 5/03* (2013.01); *G03G 21/16* (2013.01); *G03G 21/1853* (2013.01); *G03G 2215/0119* (2013.01); *G03G 2221/1654* (2013.01); *G03G 2221/1675* (2013.01)

(58) Field of Classification Search
CPC ...................................................... G03G 21/16
USPC ............................................................ 399/110
See application file for complete search history.

(56) References Cited

FOREIGN PATENT DOCUMENTS

| JP | 10-119395 | A |   | 5/1998 |   |
|----|-----------|---|---|--------|---|
| JP | 2004-246063 | A |   | 9/2004 |   |
| JP | 2008-003403 | A |   | 1/2008 |   |
| JP | 2008-262087 | A |   | 10/2008 |   |
| JP | 2008-310151 |   | * | 12/2008 | ............ G03G 21/16 |
| JP | 2008-310151 | A |   | 12/2008 |   |
| JP | 2010-199175 |   | * | 9/2010 | ............ G03G 21/16 |
| JP | 2010-199175 | A |   | 9/2010 |   |
| JP | 2011-252321 | A |   | 12/2011 |   |

\* cited by examiner

*Primary Examiner* — Clayton E Laballe
*Assistant Examiner* — Kevin Butler
(74) *Attorney, Agent, or Firm* — Knobbe Martens Olson & Bear LLP

(57) ABSTRACT

An image forming apparatus includes: a cover that is openable and closable. The cover is provided with a lock member, a first biasing portion, a lever member, and a second biasing portion. The lock member is movable between a locking position and an unlocking position. The first biasing portion biases the lock member toward the unlocking position. The lever member is provided to be in contact with the lock member, the lever member being movable between a retaining position for retaining the lock member at the locking position and a retention releasing position for releasing retention of the lock member in a direction intersecting with a moving direction of the lock member. The second biasing portion biases the lever member toward the retaining position.

6 Claims, 12 Drawing Sheets

IMAGE FORMING APPARATUS

CROSS-REFERENCE TO RELATED APPLICATIONS

This application is the U.S. National Phase under 35. U.S.C. §371 of International Application PCT/JP2013/057726, filed Mar. 18, 2013, which claims priority to Japanese Patent Application No. 2012-063304, filed Mar. 21, 2012. The disclosures of the above-described applications are hereby incorporated by reference in their entirety. The International Application was published under PCT Article 21(2) in a language other than English.

TECHNICAL FIELD

The present invention relates to an image forming apparatus, and particularly to an image forming apparatus provided with a cover that is attached to an apparatus main body, which includes an image forming unit, to be openable and closable.

BACKGROUND ART

Conventionally, an image forming apparatus such as a copy machine, a printer and the like is provided with a cover that is attached to an apparatus main body, which includes an image forming unit, to be openable and closable. The cover is closed during normal use of the image forming apparatus, and opened in a case of clearing a paper jam that occurs in the apparatus main body and the like.

For example, Patent Document 1 discloses a cover provided with an open/close lever, a shaft connected to the open/close lever, and hook members connected to both ends of the shaft. In this prior art, a state in which the cover is closed with respect to the apparatus main body is maintained by a hook member retained on a hook member retention portion provided on the apparatus main body. On the other hand, by lifting up the open/close lever, the shaft and the hook members rotate in accordance therewith, to thereby release the hook member from the retention state with respect to the hook member retention portion, and allow opening of the cover with respect to the apparatus main body.

Patent Document 1: Japanese Unexamined Patent Application Publication No. 2004-246063

DISCLOSURE OF THE INVENTION

Problems to be Solved by the Invention

However, in a case of attempting to open the cover, which is attached to a rear face of the apparatus main body, from a front face side of the apparatus main body, an operator is forced to reach out his/her hand from the front face side to the rear face side of the apparatus main body in order to lift the open/close lever. This made a task of opening the cover cumbersome.

In addition, in the prior art disclosed in Patent Document 1, a direction in which the open/close lever can be lifted is limited to one direction and a lifting direction of the open/close lever cannot be adjusted according to a posture and a position of the operator. This lowered operability of a task of opening the cover.

Given this, the present invention is aimed at providing a cover that can easily be opened and closed without making the task of an operator such as a user and a serviceperson cumbersome.

Means for Solving the Problems

An image forming apparatus of the present invention is an image forming apparatus provided with: an apparatus main body that has an image forming unit and a main body side engaging portion; and a cover that is attached to the apparatus main body to be openable and closable. The cover is provided with a lock member, a first biasing portion, a lever member, and a second biasing portion. The lock member is movable between a locking position where the lock member engages with the main body side engaging portion and an unlocking position where the lock member is released from engagement with the main body side engaging portion. The first biasing portion biases the lock member toward the unlocking position. The lever member is provided to be in contact with the lock member, the lever member being movable between a retaining position for retaining the lock member at the locking position and a retention releasing position for releasing retention of the lock member in a direction intersecting with a moving direction of the lock member. The second biasing portion biases the lever member toward the retaining position. In a state in which the lever member is not pressed, the lever member is maintained at the retaining position under a biasing force of the second biasing portion. The lock member is retained at the locking position against the biasing force of the first biasing portion, to thereby restrict opening of the cover with respect to the apparatus main body. When the lever member is pressed from an upper side to move the lever member from the retaining position to the retention releasing position against the biasing force of the second biasing portion, the lock member moves from the locking position to the unlocking position by the biasing force of the first biasing portion, to thereby allow opening of the cover with respect to the apparatus main body.

PREFERRED MODE FOR CARRYING OUT THE INVENTION

Figure 1:
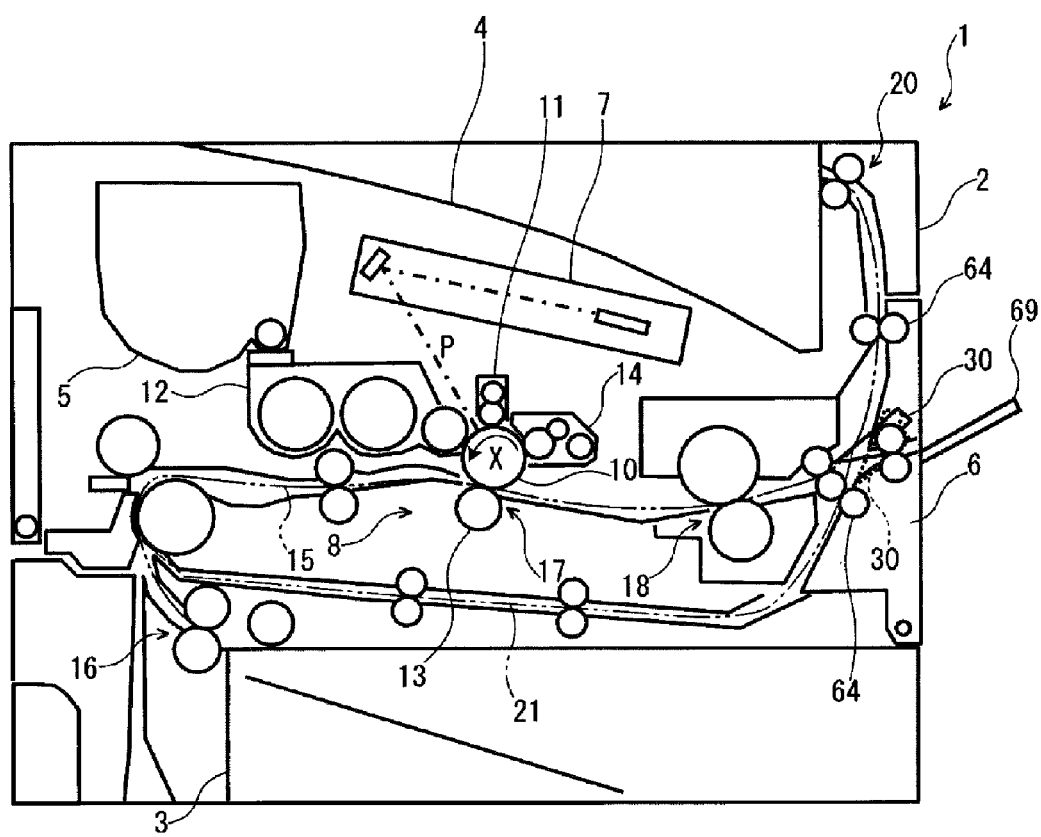
FIG. 1 is a schematic view showing an outline of a printer according to one embodiment of the present invention.
Figure 2:
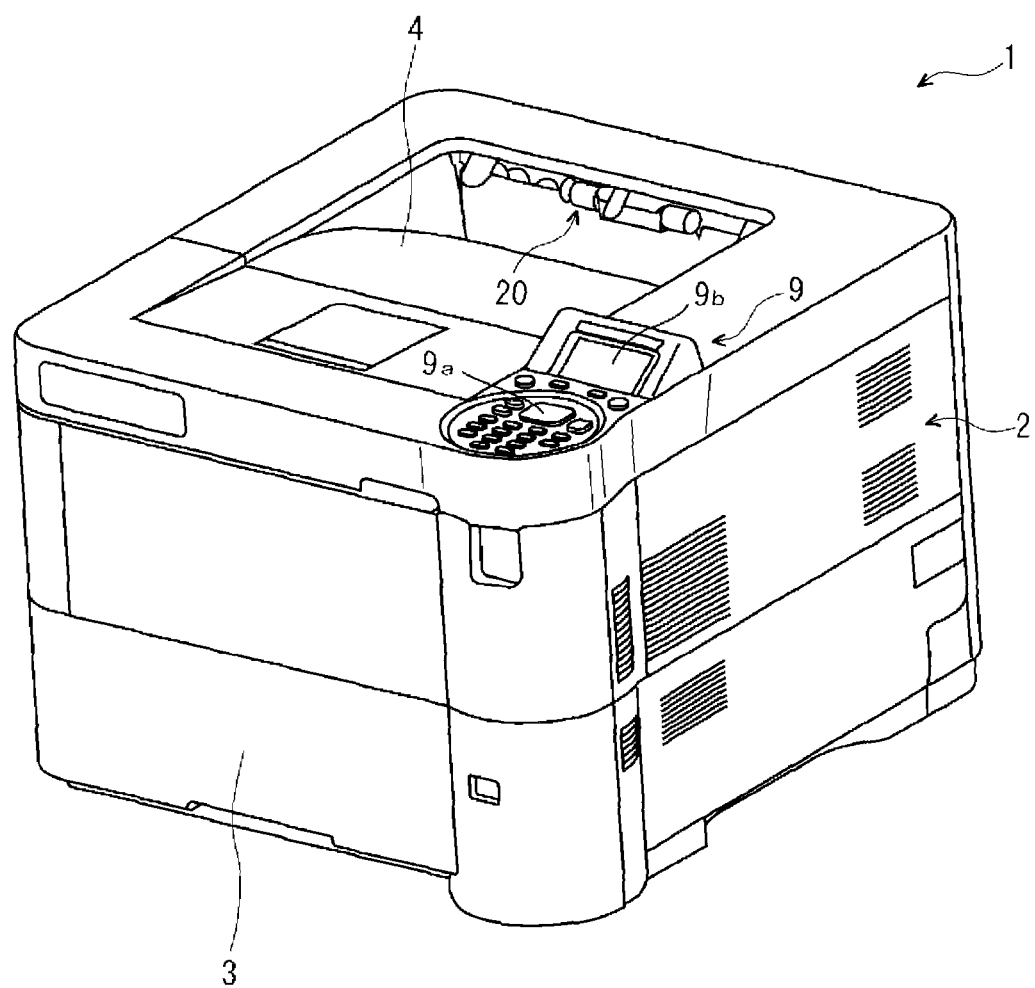
FIG. 2 is a perspective view illustrating an external view taken diagonally from a front side of the printer according to one embodiment of the present embodiment.

An overall configuration of a printer 1 employing xerography is described with reference to FIGS. 1 and 2. FIG. 1 is a schematic view showing an outline of a printer according to one embodiment of the present invention. FIG. 2 is a perspective view illustrating an external view taken diagonally from a front side of the printer. A left side in FIG. 1 is a front side of the printer 1.

The printer 1 is provided with a printer main body 2 having a box-like shape. A paper feeding cassette 3 for storing paper is housed in a lower portion of the printer main body 2. The paper feeding cassette 3 is withdrawable to the front face side of the printer 1 and can be replenished with paper in a state of being withdrawn. A discharged paper tray 4 is provided on an upper face of the printer main body 2. A toner container 5 is housed on a lower front side of the discharged paper tray 4. The rear face cover 6 is attached to a rear face of the printer main body 2 to be openable and closable.

An exposure device 7 composed of a laser scanning unit (LSU) is disposed in an upper portion of the printer main body 2, below the discharged paper tray 4. An image forming unit 8 is provided below the exposure device 7. An operation panel 9 used for configuring setting of various functions of the printer 1 is provided on the front face side of an upper face of the printer main body 2, on a right side of the discharged paper tray 4. A plurality of button keys 9a for input of setting and a display unit 9b for display of setting information and the like are provided in the operation panel 9. A photosensitive drum 10, which is an image supporting body, is rotatably provided in the image forming unit 8. In the periphery of the photosensitive drum 10, a charging device 11, a developing device 12, a transfer roller 13, and a cleaning device 14 are arranged along a rotational direction (see arrow X in FIG. 1) of the photosensitive drum 10.

A conveyance path 15 for paper is provided inside the printer main body 2. A paper feeding unit 16 is provided at an upstream side end of the conveyance path 15. A transfer unit 17 that is composed of the photosensitive drum 10 and the transfer roller 13 is provided in a midstream part of the conveyance path 15. A fusing device 18 is provided in a downstream part of the conveyance path 15. A paper discharging unit 20 is provided at a downstream side end of the conveyance path 15. A reversing path 21 for duplex printing is formed below the conveyance path 15.

Next, an image forming operation of the printer 1 having such a configuration is described. When the printer 1 is powered on, various parameters are initialized, and initial settings such as temperature setting of the fusing device 18 takes place in accordance with setting conditions specified from the operation panel 9 and the like. And then, when image data is input from a computer or the like connected to the printer 1 and a print start instruction is made, image forming operation is performed as follows.

First, the charging device 11 electrically charges the surface of the photosensitive drum 10, and then a laser beam (see a dashed-dotted line P in FIG. 1) from the exposure device 7 performs exposure with respect to the photosensitive drum 10 according to the image data, to thereby form an electrostatic latent image on a surface of the photosensitive drum 10. And then, a developing device 12 develops the electrostatic latent image with a toner, to form a toner image.

Meanwhile, the paper picked up by the paper feeding unit 16 from the paper feeding cassette 3 is conveyed to the transfer unit 17 in sync with the image forming operation described above. In the transfer unit 17, the toner image on the photosensitive drum 10 is transferred to the paper. The paper with the toner image thus transferred thereto is conveyed toward a downstream side of the conveyance path 15 and enters the fusing device 18. In the fusing device 18, the toner image is fused onto the paper. The paper onto which the toner image is fused is then discharged from the paper discharging unit 20 to the discharged paper tray 4. It should be noted that the residual toner on the photosensitive drum 10 is removed by the cleaning device 14.

Figure 3:
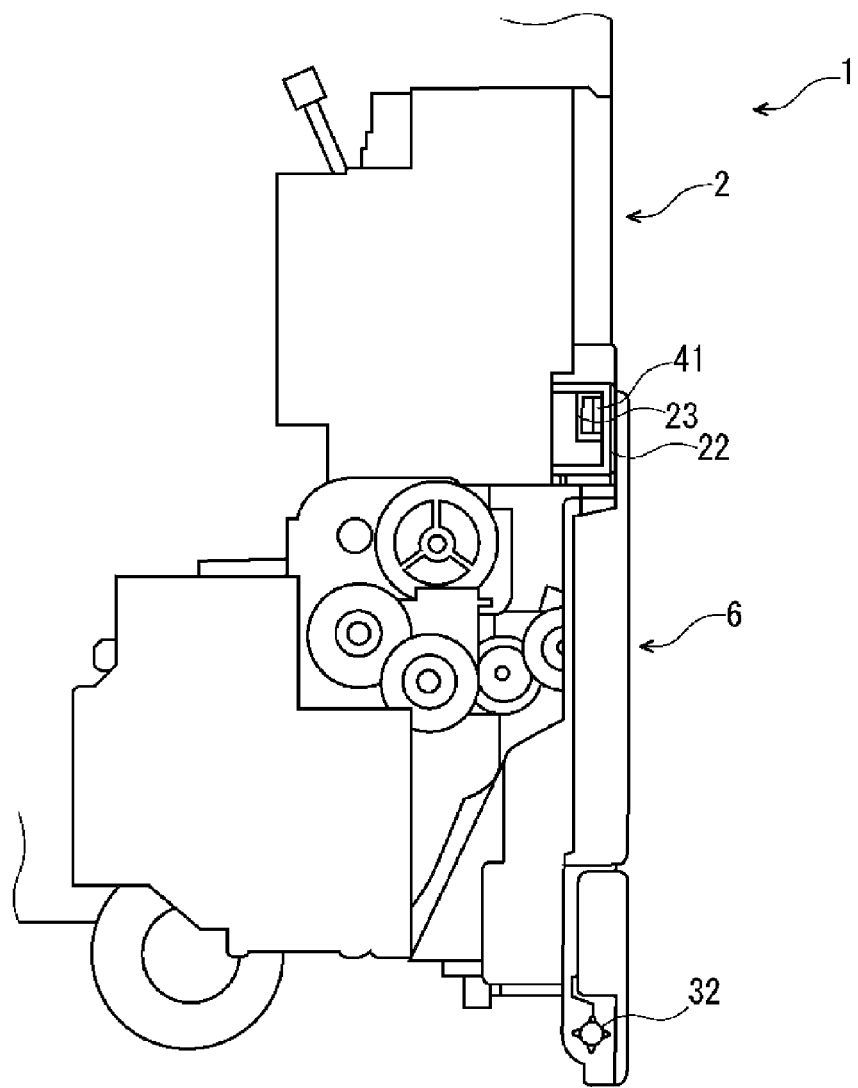
FIG. 3 is a side view illustrating a state in which a rear face cover is closed in the printer according to one embodiment of the present invention.
Figure 4:
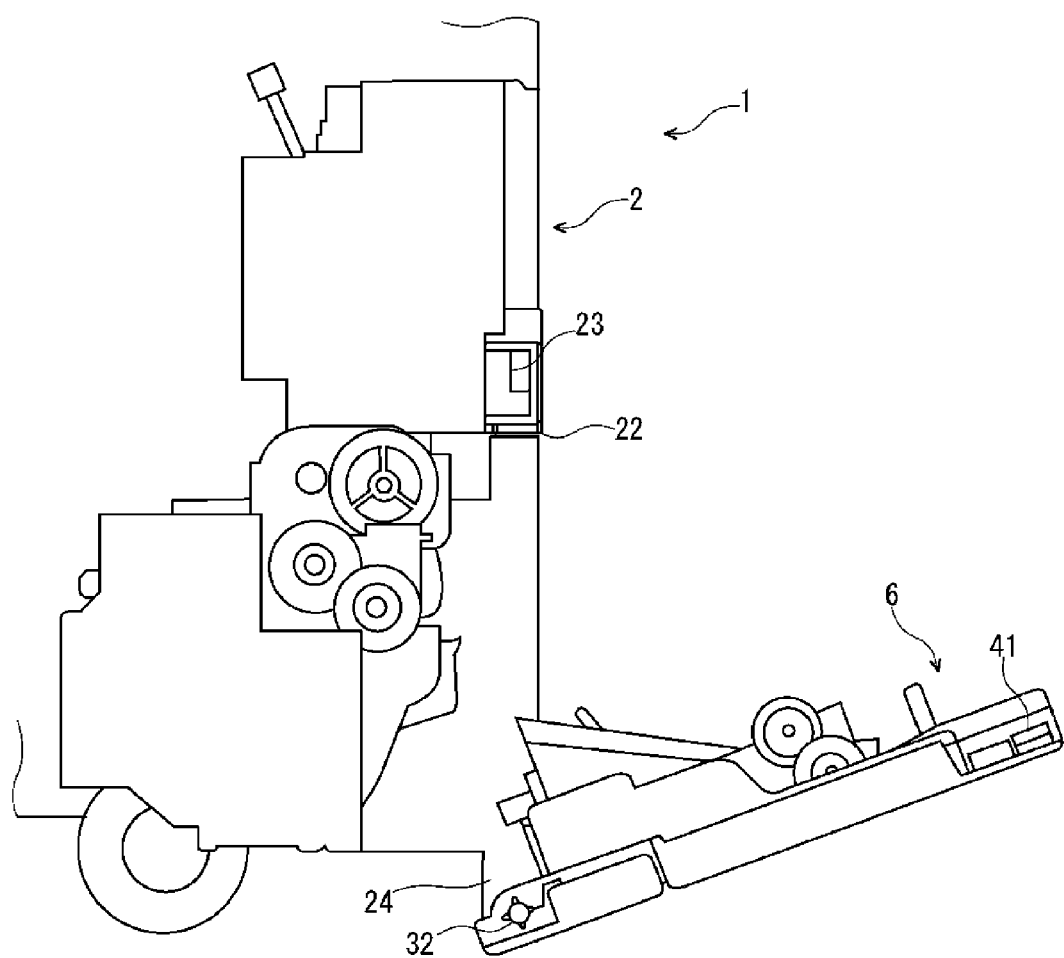
FIG. 4 is a side view illustrating a state in which the rear face cover is opened in the printer according to one embodiment of the present invention.
Figure 5:
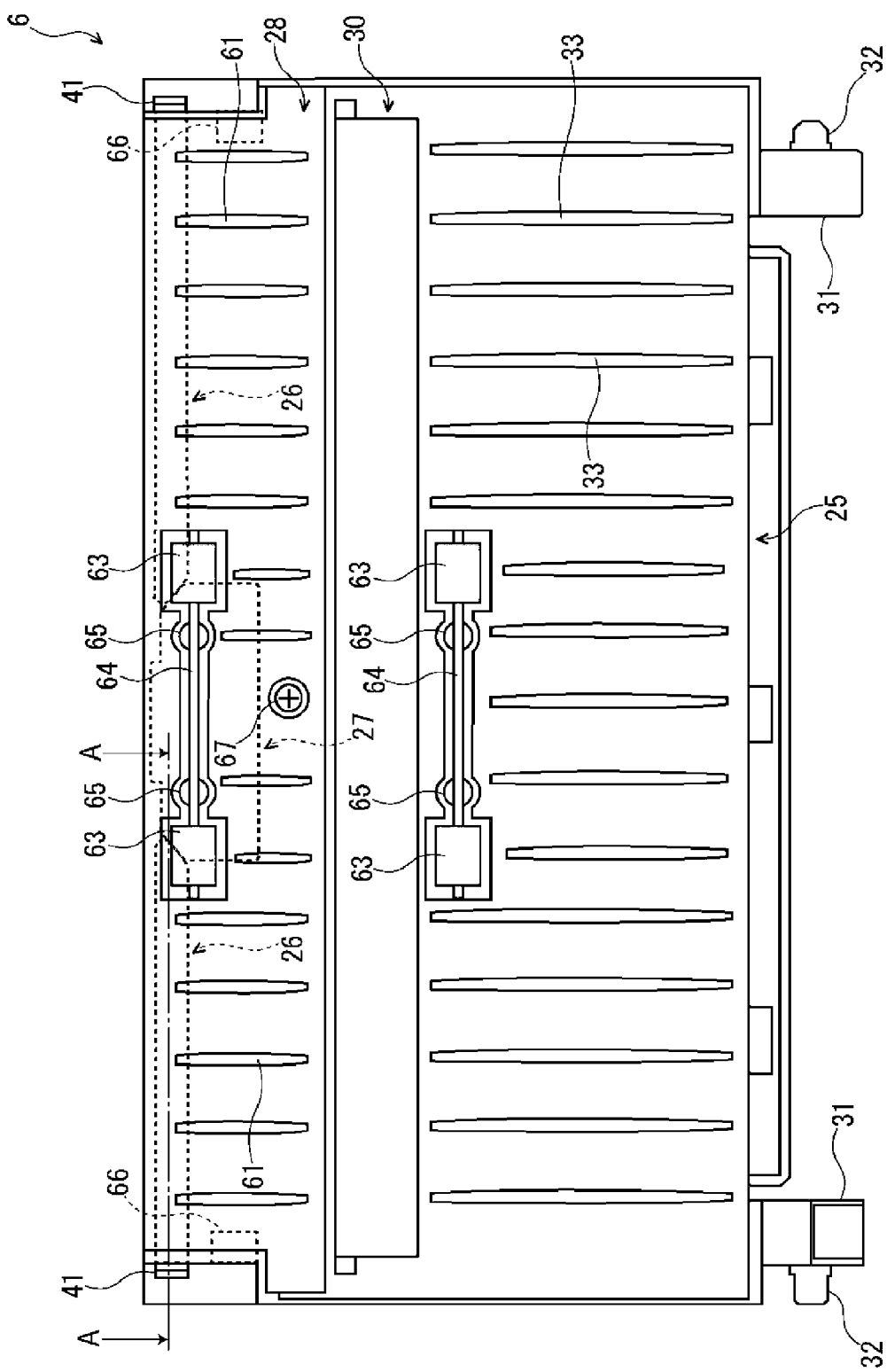
FIG. 5 is a front view illustrating the rear face cover in the printer according to one embodiment of the present invention.
Figure 6:
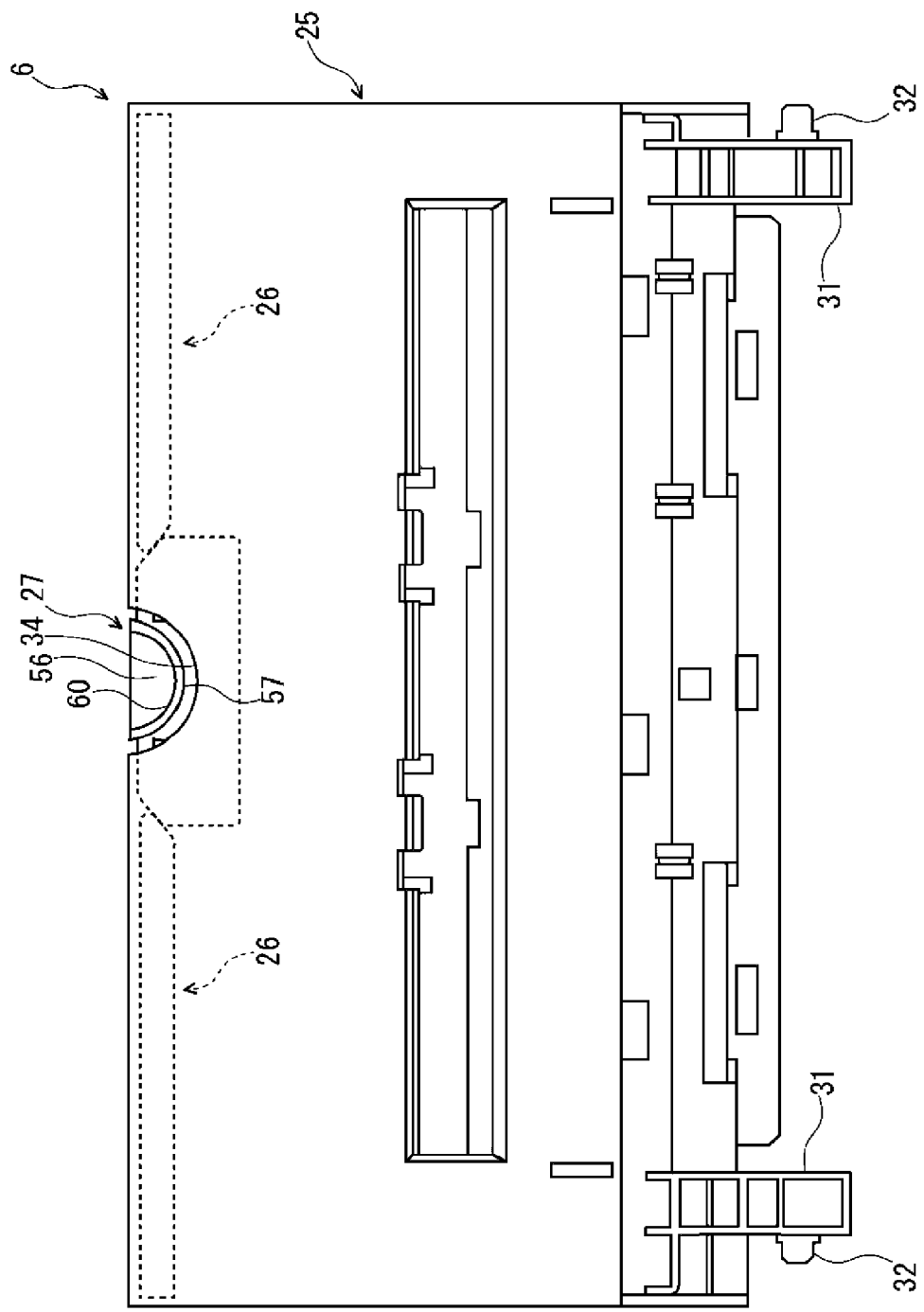
FIG. 6 is a rear view illustrating the rear face cover in the printer according to one embodiment of the present invention.
Figure 7:
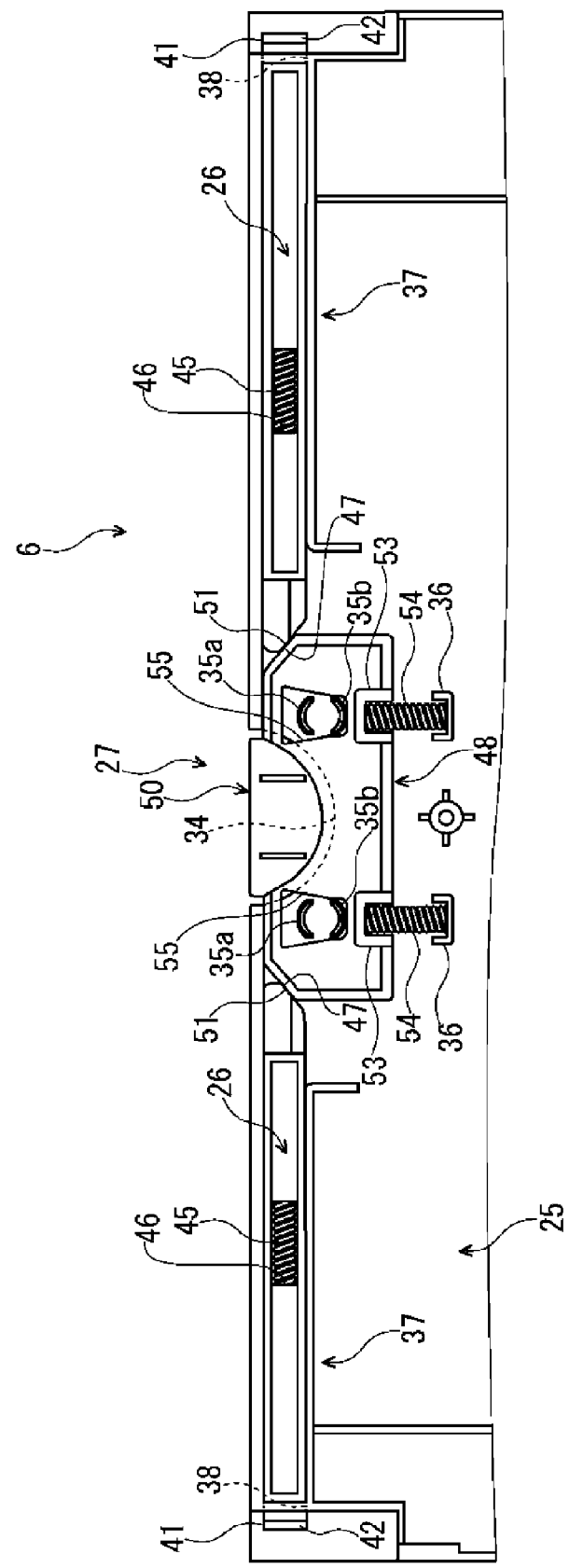
FIG. 7 is a front view illustrating a state before the lever member is pressed, in the rear face cover of the printer according to one embodiment of the present invention.
Figure 8:
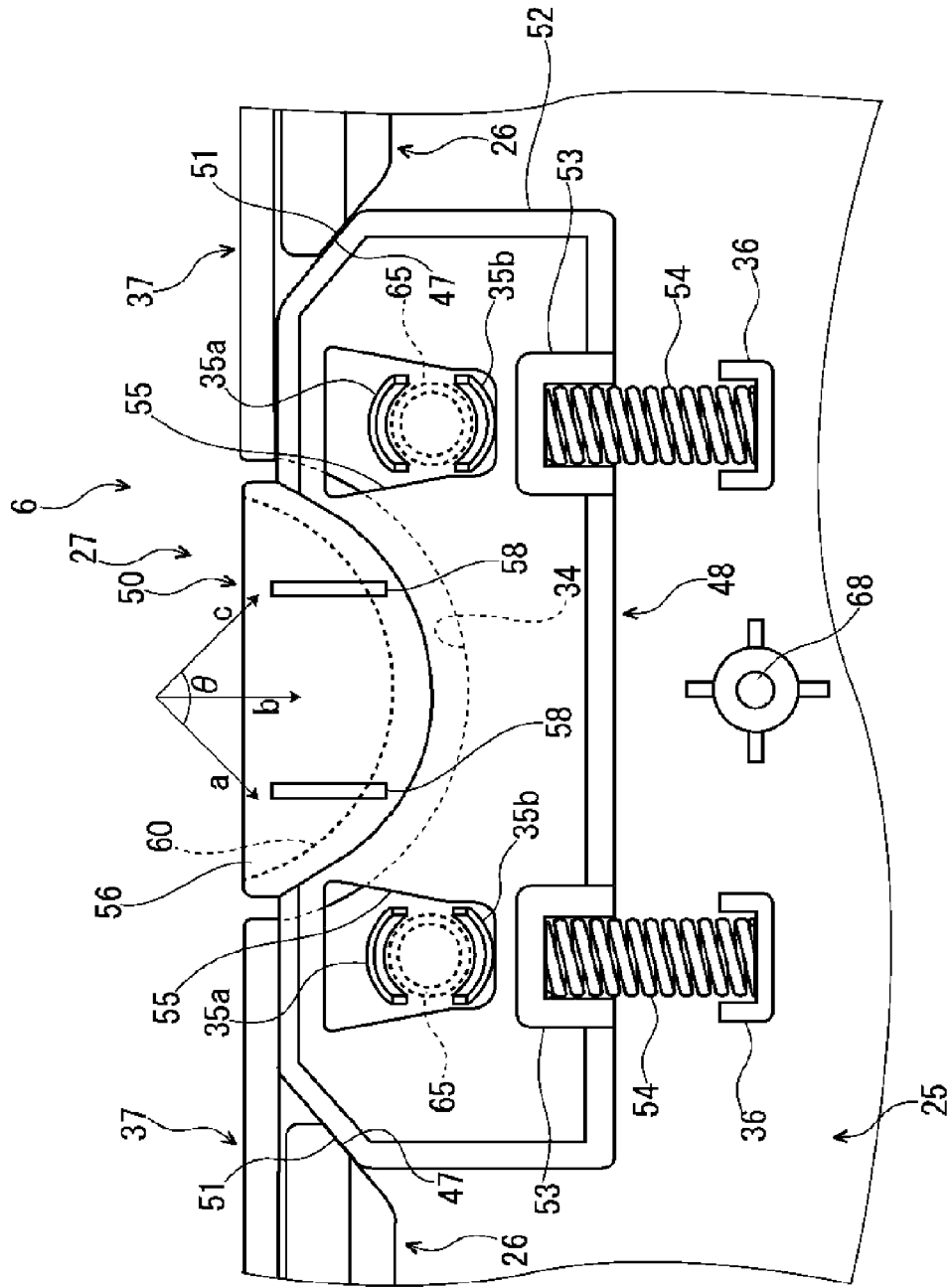
FIG. 8 is an enlarged view of a major part of FIG. 7.
Figure 9:
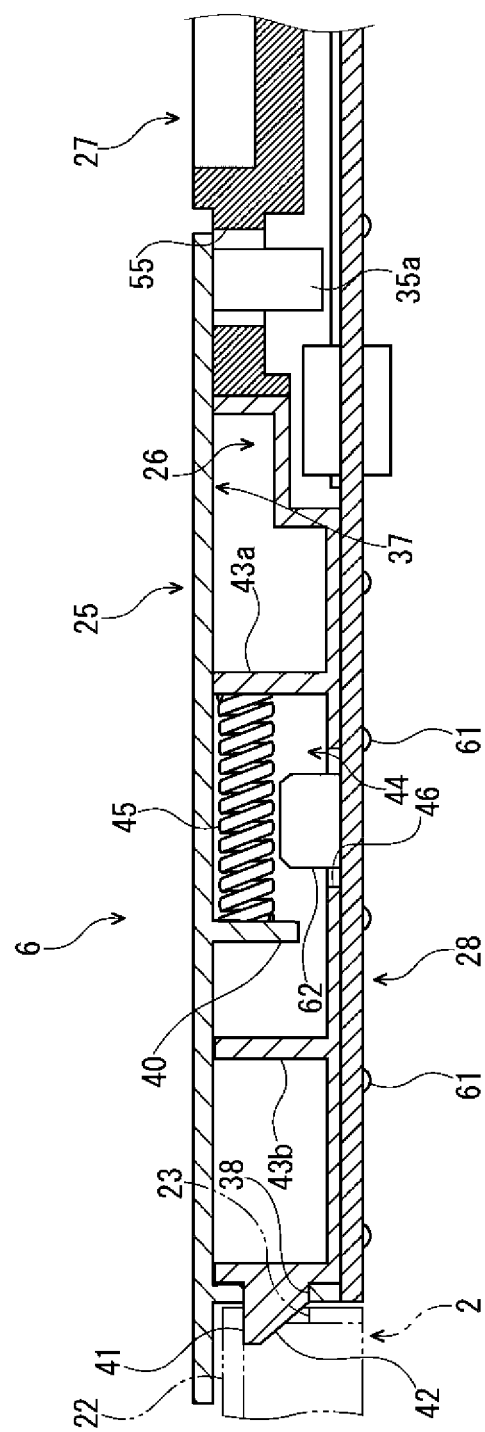
FIG. 9 is a cross-sectional view taken along a line A-A of FIG. 5.
Figure 10:
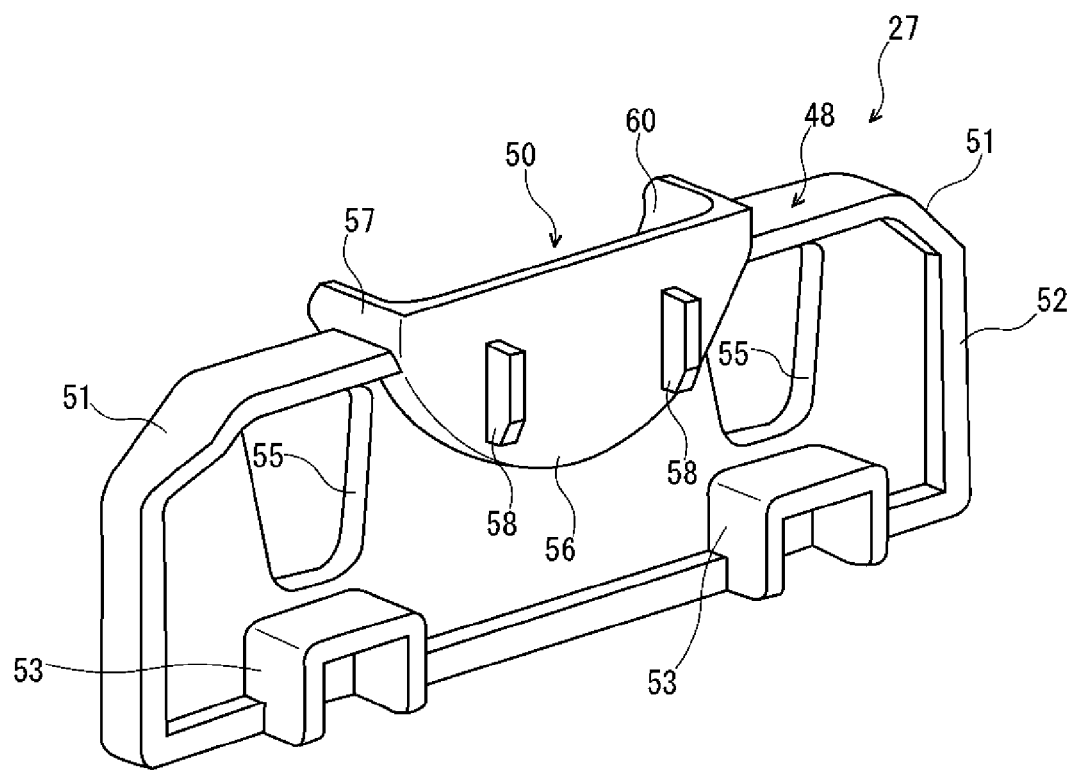
FIG. 10 is a perspective view illustrating the lever member in the rear face cover of the printer according to one embodiment of the present invention.
Figure 11:
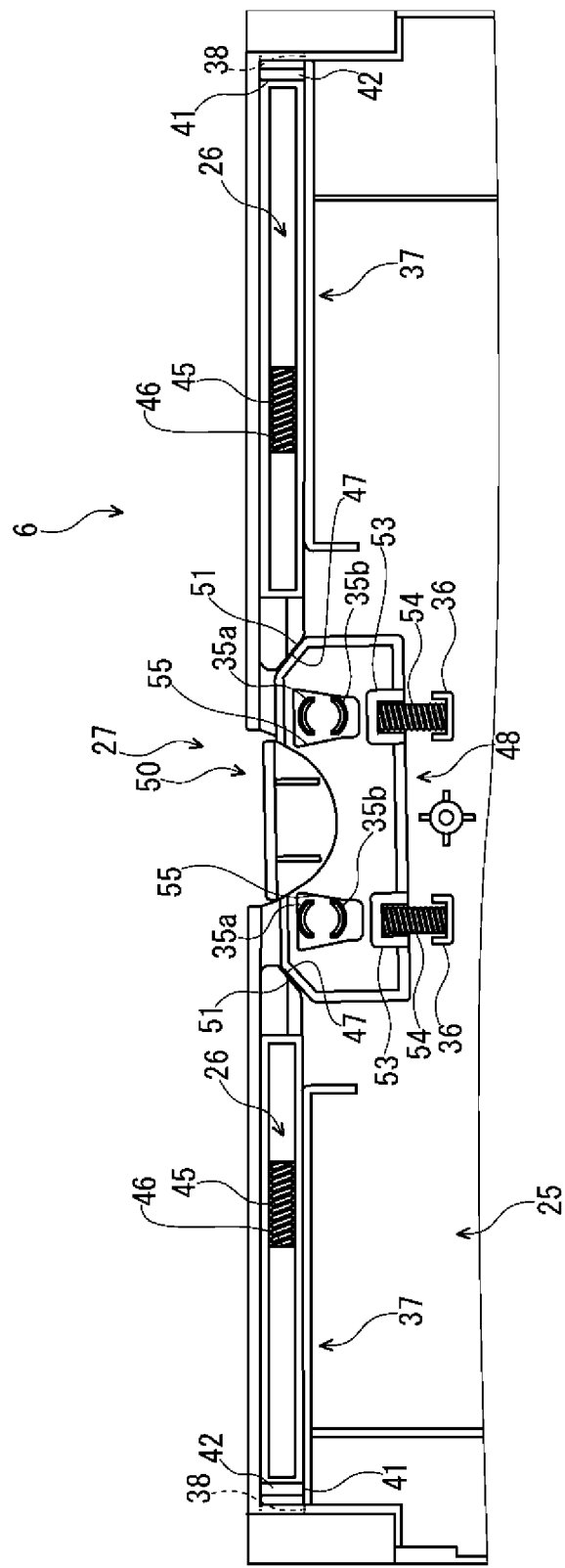
FIG. 11 is a front view illustrating a state in which the lever member is pressed, in the rear face cover of the printer according to one embodiment of the present invention.
Figure 12:
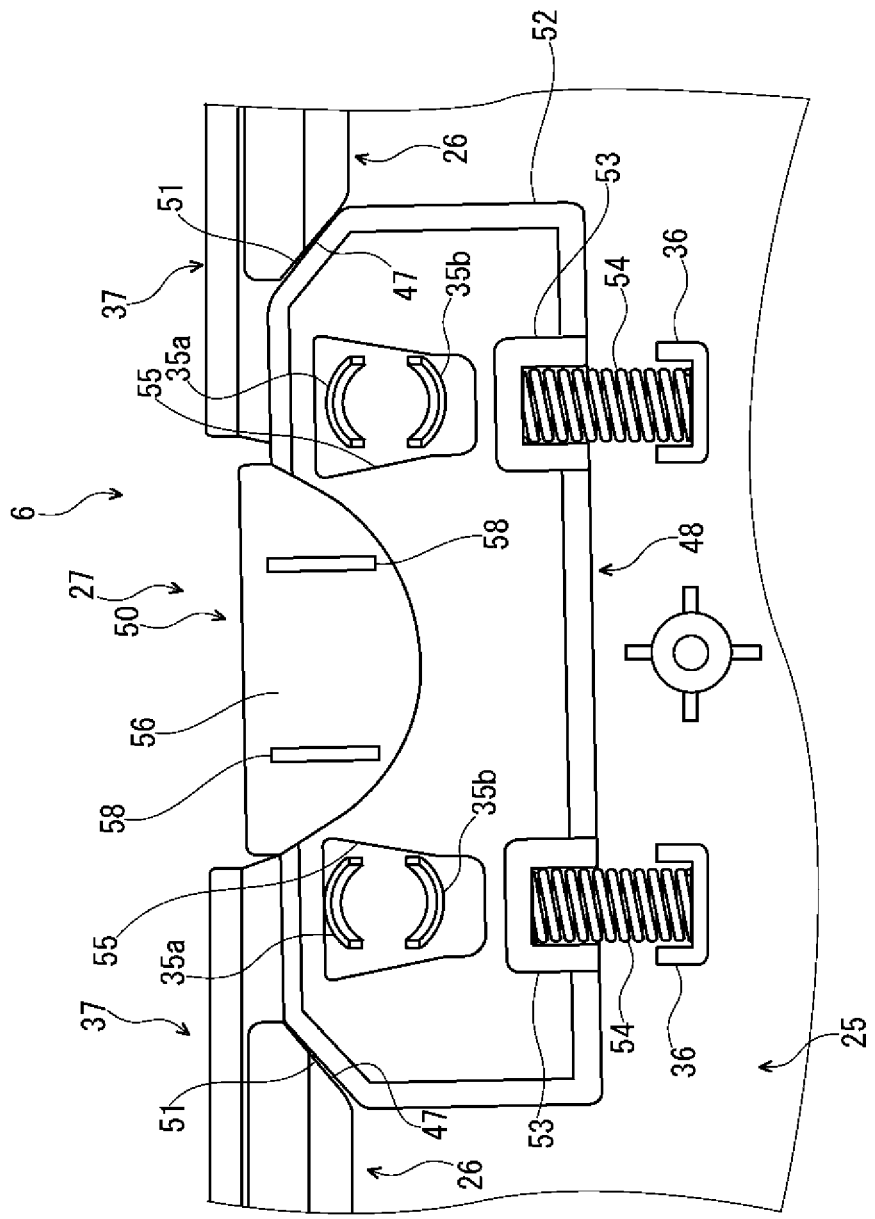
FIG. 12 is an enlarged view of a major part of FIG. 11.

Next, a configuration of a rear end portion of the printer main body 2 and a configuration of the rear face cover 6 are described in detail with reference to FIGS. 1 to 12. FIG. 3 is a side view illustrating a state in which a rear face cover is closed in the printer according to one embodiment of the present invention. FIG. 4 is a side view illustrating a state in which the rear face cover is opened in the printer according to one embodiment of the present invention. FIG. 5 is a front view illustrating the rear face cover in the printer according to one embodiment of the present invention. FIG. 6 is a rear view illustrating the rear face cover in the printer according to one embodiment of the present invention. FIG. 7 is a front view illustrating a state before the lever member is pressed, in the rear face cover of the printer according to one embodiment of the present invention. FIG. 8 is an enlarged view of a major part of FIG. 7. FIG. 9 is a cross-sectional view taken along a line A-A of FIG. 5. FIG. 10 is a perspective view illustrating the lever member in the rear face cover of the printer according to one embodiment of the present invention. FIG. 11 is a front view illustrating a state in which the lever member is pressed, in the rear face cover of the printer according to one embodiment of the present invention. FIG. 12 is an enlarged view of a major part of FIG. 11.

Hereinafter, in the front view and the plain view, expressions such as "outer side", "outer face" and the like refer to outer sides in a lateral direction of the printer main body 2 seen from a front side (a left side for a component on a left side and a right side for a component on a right side). Expressions such as "inner side", "inner face" and the like refer to inner sides in a lateral direction of each component (a right side for a component on a left side and a left side for a component on a right side).

First, a configuration of the rear end portion of the printer main body 2 is described. As shown in FIGS. 3 and 4, a pair of supporting frames 22 on right and left sides (only the supporting frame 22 on the right side is illustrated in FIGS. 3 and 4) is provided in a center in a vertical direction of the rear end portion of the printer main body 2. An engagement hole 23 as the main body side engaging portion is provided on an inner side face of each of the supporting frames 22. The engagement hole 23 has a vertically elongated rectangular shape in a side view. As shown in FIG. 4, a supporting plate 24 that protrudes downward is provided at a lower end of the rear end portion of the printer main body 2. A bearing portion (not illustrated) is provided on the supporting plate 24.

Configuration of the rear face cover 6 is described in detail hereinafter. As shown in FIGS. 5 and 6, the rear face cover 6 is composed mainly of a supporting member 25, a pair of lock members 26, a lever member 27, a conveyance guide 28, and a branch guide 30. The supporting member 25 constitutes an outer shape of the rear face cover 6 and has a laterally elongated rectangular shape. The pair of lock members 26 is arranged on right and left sides of an upper end portion of the supporting member 25. The lever member 27 is arranged on an inner side of the pair of lock members 26. The conveyance guide 28 is arranged at an upper end of a front face side of the supporting member 25 so as to cover the lock member 26 and the lever member 27. The branch guide 30 is disposed on a lower side of the conveyance guide 28. It should be noted that illustration of the conveyance guide 28 is omitted in FIGS. 7, 8, 11, and 12.

A supporting piece 31 is provided to protrude, on both right and left ends of a lower end portion of the supporting member 25. A supporting shaft 32 is provided to protrude outward, on each of the supporting pieces 31. The supporting shaft 32 thus engages with the bearing portion (not illustrated) provided on the supporting plate 24 (refer to FIG. 4) of the printer main body 2. The rear face cover 6 is thus made rotatable about the supporting shaft 32. Position of the rear face cover 6 is thus switchable between a closed position (refer to FIG. 3) and an opened position (refer to FIG. 4). As shown in FIG. 5, a plurality of lower conveyance ribs 33 is protrudingly provided along a vertical direction, from a lower end portion toward a center in a vertical direction of a front face of the supporting member 25. The lower conveyance ribs 33 are arranged at predetermined intervals in a lateral direction.

As shown in FIG. 6, an attachment groove 34, which is semicircular arcuate in a rear view, is provided concavely in a center in a lateral direction of the upper edge portion of the supporting member 25. As shown in FIGS. 7 and 8, upper and lower protruding portions 35a, 35b are provided in pairs on the front face of the supporting member 25, on a left lower side and a right lower side of the attachment groove 34. Each of the protruding portions 35a, 35b protrudes toward the lever member 27 (outer side in the present embodiment). The upper protruding portion 35a is curved upward in an arcuate shape. The lower protruding portion 35b is curved downward in an arcuate shape. On a lower side of each lower protruding portion 35b, a supporting member side spring bearing portion 36, which has a U-shape in a front view, is provided.

As shown in FIG. 7, at an upper end portion of the front face of the supporting member 25, lock member housing portions 37 are provided on right and left sides of the attachment groove 34. The lock member housing portion 37 has a laterally elongated rectangular frame shape and is open toward the front face side and the inner face side. As shown in FIG. 9, on an outer end portion of each of the lock member housing portions 37 (only the lock member housing portion 37 on the left side is illustrated in FIG. 9), an engagement protrusion insertion hole 38 is provided to be through in a lateral direction. In each of the lock member housing portions 37, a spring supporting portion 40 is protrudingly provided.

As shown in FIG. 7, each of the lock members 26 has a laterally elongated rectangular frame shape. The lock members 26 are stored in the respective lock member housing portions 37 of the supporting member 25, in a state of being movable in a lateral direction (inward and outward direction in the present embodiment). As shown in FIG. 9, each of the lock members 26 (only the lock member 26 on the left side is illustrated in FIG. 9) is provided more toward a front side than the engagement hole 23 of the printer main body 2, and is open to the rear face side. An engagement protrusion 41 is provided on an outer end portion of each of the lock members 26. The engagement protrusion 41 is inserted into the engagement protrusion insertion hole 38 of the lock member housing portion 37 of the supporting member 25, and protrudes to the outer side of the lock member housing portion 37. The engagement protrusion 41 engages with the engagement hole 23 provided on the supporting frame 22 of the printer main body 2. The closed position of the rear face cover 6 (refer to FIG. 3) is thus maintained. A slope face 42 (refer to FIG. 9), which slopes outward toward a rear side, is provided on a front face side of the engagement protrusion 41.

As shown in FIG. 9, at two positions in a longitudinal direction on each of the lock members 26, divider plates 43a, 43b are protrudingly provided toward a rear side. A spring storage space 44 is formed between the inner divider plate 43a and the outer divider plate 43b. The spring storage space 44 stores a first coil spring 45 as the first biasing member. The first coil spring 45 is disposed between the spring supporting portion 40 and the inner divider plate 43a of the supporting member 25 and biases the lock members 26 toward an inner side. On a front face of each of the lock members 26, a restriction rib insertion hole 46 is provided to be through at a position corresponding to the spring storage space 44. As shown in FIGS. 7 and 8, on an inner end portion of each of the lock members 26, a first slope portion 47, which slopes outward toward a lower side, is formed.

The lever member 27 is supported by the supporting member 25 in a state of being movable in a vertical direction. In other words, the lever member 27 is movable in a direction intersecting with a moving direction of the lock member 26. As shown in FIG. 10, the lever member 27 is provided with a lever main body 48 having a laterally elongated shape and an operation portion 50 provided in a center in a lateral direction of an upper end portion of the lever main body 48.

On an upper left corner portion and an upper right corner portion of the lever main body 48 (also outer end portions of the lever member 27), respective second slope portions 51, which slope outward toward a lower side, are formed. As shown in FIGS. 7 and 8, the second slope portion 51 abuts the first slope portion 47 provided on each of the lock members 26.

As shown in FIG. 10, on an outer periphery of the lever main body 48, a flange portion 52 is protrudingly provided toward a front side. On right and left sides of a lower end portion of the lever main body 48, a lever member side spring bearing portion 53, which has a U-shape opening downward in a front view, is provided. As shown in FIGS. 7 and 8, each of the lever member side spring bearing portions 53 is positioned immediately above each of the supporting member side spring bearing portions 36. A second coil spring 54 as the second biasing portion is disposed between each of the lever member side spring bearing portions 53 and each of the supporting member side spring bearing portions 36. The second coil spring 54 biases the lever member 27 toward an upper side. A biasing force of the second coil spring 54 is set to be greater than a biasing force of the first coil spring 45.

As shown in FIG. 10, an opening portion 55 is provided on right and left sides of the lever main body 48. As shown in FIGS. 7 and 8, each of the opening portions 55 has a trapezoidal shape, increasing in width toward an upper side. The protruding portions 35a, 35b of the supporting member 25 are inserted into the respective opening portions 55. A lateral width of a lower end portion of each of the opening portions 55 corresponds to a lateral width of each of the lower protruding portions 35b (more precisely, set to be slightly greater than the lateral width of the lower protruding portions 35b).

As shown in FIG. 10, the operation portion 50 is composed of a base plate 56 having a semilunar shape directed downward and a flange plate 57. The flange plate 57 has a semicircular arcuate shape in a rear view, which protrudes from an outer periphery of the base plate 56 toward a rear side. Ribs 58 are protrudingly provided along a vertical direction, on right and left sides on a front face of the base plate 56. As shown in FIG. 6, on an upper face side of the flange plate 57, a pressing portion 60 is formed as a concave portion which is curved downward in an arcuate shape.

As shown in FIG. 5, the conveyance guide 28 has a laterally elongated rectangular shape. On a front face of the conveyance guide 28, a plurality of upper conveyance ribs 61 is protrudingly provided along a vertical direction. The upper conveyance ribs 61 are arranged at predetermined intervals in a lateral direction. In a central portion in a lateral direction of the conveyance guide 28, a rotational shaft 64, which retains driven rollers 63 rotatably, is supported to be swingable in a depth direction. In addition, the rotational shaft 64 is supported in a state of being biased toward a front side by a third coil spring 65 inserted into a space surrounded by the protruding portions 35a, 35b of the supporting member 25. Also in a central portion that is adjacent to a lower side of the branch guide 30 of the supporting member 25, the driven rollers 63 and the rotational shaft 64 are supported in a state of being biased toward a front side by a third coil spring 65. An engagement protrusion 66 is attached onto an outer end face of the conveyance guide 28 by engaging with an engaged portion (not illustrated) of the supporting member 25, as well as by screwing a central portion screw 67 into a boss 68 on the supporting member 25 (refer to FIG. 8).

As shown in FIG. 9, plate-like restriction ribs 62 (only the restriction rib 62 on the left side is illustrated in FIG. 9) are protrudingly provided on right and left sides on a rear face of the conveyance guide 28. Each of the restriction ribs 62 is inserted into the spring storage space 44 through the restriction rib insertion hole 46 on the lock member 26. A tip end portion of each of the restriction ribs 62 opposes the first coil spring 45. Deflection of the first coil spring 45 is thus restricted.

As shown in FIG. 5, the branch guide 30 has a laterally elongated shape. The branch guide 30 is swingably supported by the supporting member 25. As shown in FIG. 1, the position of the branch guide 30 can be switched between a first position (refer to a solid line in FIG. 1) for discharging the paper to an attachable and detachable tray 69 and a second position (refer to a broken line in FIG. 1) for discharging the paper to the discharged paper tray 4 or transferring the paper to a reversing path 21.

In the embodiment configured as described above, during normal use of the printer 1 (when the lever member 27 is not pressed), the lever member 27 is biased upward and pushed up by the biasing force of the second coil spring 54 as shown in FIG. 8. As a result, as shown in FIG. 7, the second slope portion 51 of the lever member 27 retains the first slope portion 47 of each of the lock members 26 against the biasing force of the first coil spring 45. The position of the lever member 27 in this state is referred to as a "retaining position".

In addition, each of the lock members 26, which is retained by the lever member 27, has been moved to an outer side and the engagement protrusion 41 of each of the lock members 26 engages with the engagement hole 23 of the printer main body 2. Opening of the rear face cover 6 with respect to the printer main body 2 is thus restricted. The position of each of the lock member 26 in this state is referred to as a "locking position".

From this state, an operator such as a user and a serviceperson presses the pressing portion 60 of the lever member 27 from an upper side with at least a predetermined force, a resultant force of the pressing force and the biasing force of the first coil spring 45 is greater than the biasing force of the second coil spring 54. As a result, as shown in FIGS. 11 and 12, the lever member 27 moves downward from the retaining position along the vertical direction, against the biasing force of the second coil spring 54. The position of the lever member 27 in this state is referred to as a "retention releasing position".

As the lever member 27 thus moves from the retaining position to the retention releasing position, retention of the first slope portion 47 of each of the lock member 26 by the second slope portion 51 of the lever member 27 is released. In accordance with this, as shown in FIG. 11, each of the lock member 26 moves to the inner side along the inward and outward direction by the biasing force of the first coil spring 45, and the engaging protrusion 41 of each of the lock members 26 disengages from the engagement hole 23 of the printer main body 2 (not illustrated in FIG. 11). Here, the supporting member 25 is biased toward the rear side by the third coil spring 65 in the vicinity of the lock member 26, to thereby allow easy opening of the rear face cover 6. The operator thus can clear a paper jam by opening the rear face cover 6 with respect to the printer main body 2. The position of each of the lock member 26 in this state is referred to as an "unlocking position".

In the present embodiment, the rear face cover 6 can be opened by an operation of pressing the lever member 27, as described above. As a result, compared to a configuration in which the rear face cover 6 is opened by an operation of lifting up the lever member 27, the lever member 27 can be more easily operated in a case of opening the rear face cover 6 from the front face side of the printer main body 2 and the like. This can alleviate the operational burden of an operator such as a user and a serviceperson, and can make the paper jam clearance easier. In addition, the rear face cover 6, which is opened and closed by such pressing operation, can be formed in a simple configuration, allowing reduction in the manufacturing cost.

In addition, in the present embodiment, as shown in FIG. 8, the lower protruding portion 35b of the supporting member 25 engages with a lower end portion, which is the smallest in width, of the opening portion 55 of the lever member 27, in a state in which the lever member 27 is not yet pressed. Looseness between the supporting member 25 and the lever member 27 is thus restricted.

From this state, if the lever member 27 is pressed in a direction shown by an arrow a in FIG. 8, as shown in FIG. 12, the opening portion 55 of the lever member 27 moves to a lower left side while maintaining an engaged state with the protruding portions 35a, 35b of the supporting member 25. Alternatively, if the lever member 27 is pressed in a direction shown by an arrow b in FIG. 7, the opening portion 55 moves vertically downward while maintaining the engaged state with the protruding portions 35a, 35b. Yet alternatively, if the lever member 27 is pressed in a direction shown by an arrow c in FIG. 8, the opening portion 55 moves to a lower right side while maintaining the engaged state with the protruding portions 35a, 35b. In other words, the lever member 27 can be moved from the retaining position to the retention releasing position by pressing the lever member 27 to any direction within a range of an angle θ formed by the direction indicated by the arrow a and the direction indicated by the arrow c (approximately 90 in the present embodiment).

In the present embodiment, even in a case in which the direction of pressure on the lever member 27 is misaligned from an expected direction (in the present embodiment, a vertically downward direction indicated by the arrow b in FIG. 8) due to a posture and position of an operator and the like, the lever member 27 can thus be moved from the retaining position to the retention releasing position. As a result, operability of a task of opening the rear face cover 6 can be improved.

In addition, the opening portion 55 increases in width toward an upper side. In a state in which the lever member 27 is not yet pressed, since the protruding portion 35b engages with the lower end portion, which is the smallest in width, of the opening portion 55, looseness between the lever member 27 and the supporting member 25 can be restricted. In addition, when the lever member 27 is pressed, since the protruding portion 35b engages with a portion having a greater width of the opening portion 55, the lever member 27 can be moved in a plurality of directions along the direction of pressure.

In the present embodiment, the opening portion 55 has a substantially trapezoidal shape increasing in width toward an upper side; however, the present invention is not limited thereto and can have a triangular shape or the like increasing in width toward an upper side.

In the present embodiment, the opening portions 55 of the lever member 27 are formed at positions corresponding to the protruding portions 35a, 35b on the supporting member 25 into which the third coil springs 65 are inserted; however, the present invention is not limited thereto. In a different embodiment in which the driven rollers 64 are not necessary, a concave portion can be formed on the supporting member 25 in place of the opening portion 55, and the protruding portions 35a, 35b can be formed on the lever member 27. In this case, a shape of the concave portion is configured such that a width thereof increases toward a lower side, while making the protruding portions 35a, 35b protrude toward the supporting member 25.

In the present embodiment, a case in which the configuration of the present disclosure is applied to the rear face cover 6 which is rotatable; however, the present invention is not limited thereto. For example, the configuration of the present invention can also be applied to a cover which is configured to be withdrawable and formed integrally with the paper feeding cassette 3. In addition, the present invention is not limited to the rear face cover 6, and can be applied to any outer cover, such as an upper face cover, a front face cover, right and left side face covers, and the like.

In the present embodiment, a case in which the configuration of the present invention is applied to the printer 1 is described; however, the present invention is not limited thereto. The present invention can also be applied to other image forming apparatuses such as a copy machine, a facsimile machine, a digital multi function peripheral, and the like.

What is claimed is:

1. An image forming apparatus comprising:
an apparatus main body that has an image forming unit and a main body side engaging portion; and
a cover that is attached to the apparatus main body to be openable and closable,
wherein the cover comprises:
a lock member that is linearly movable in a longitudinal direction of the cover between a locking position where the lock member engages with the main body side engaging portion and an unlocking position where the lock member the main body side engaging portion;
a first biasing portion that biases the lock member toward the unlocking position;
a lever member that is provided to be in contact with the lock member, the lever member being movable between a retaining position for retaining the lock member at the locking position and a retention releasing position for releasing retention of the lock member in a direction intersecting with a moving direction of the lock member; and
a second biasing portion that biases the lever member toward the retaining position,
wherein: in a state in which the lever member is not pressed, the lever member is maintained at the retaining position under a biasing force of the second biasing portion, while the lock member is retained at the locking position against the biasing force of the first biasing portion, to thereby restrict opening of the cover with respect to the apparatus main body; and
when the lever member is pressed from an upper side to move the lever member from the retaining position to the retention releasing position against the biasing force of the second biasing portion, the lock member moves from the locking position to the unlocking position by the biasing force of the first biasing portion, to thereby allow opening of the cover with respect to the apparatus main body.

2. The image forming apparatus according to claim 1, wherein: the main body side engaging portion is provided more on an outer side than the lock member; an outer end portion of the lock member is provided to be engageable with the main body side engaging portion; the lever member is provided at an inner side of the lock member to be movable in upward and downward directions; an outer end portion of the lever member is provided to be abuttable on an inner end portion of the lock member; a slope portion is formed on at least one of the outer end portion of the lever member and the inner end portion of the lock member; and the lock member moves in inward and outward directions in accordance with the movement of the lever member in the upward and downward directions.

3. The image forming apparatus according to claim 1, wherein: the apparatus main body has a box-like shape; and the cover is provided on a rear face of the apparatus main body to be openable and closable.

4. The image forming apparatus according to claim 1, wherein: an arcuate concave portion that is directed downward is formed on the lever member; and, by pressing the concave portion from an upper side, the lever member moves downward and can move the lock member to the unlocking position.

5. An image forming apparatus comprising:
an apparatus main body that has an image forming unit and a main body side engaging portion; and
a cover that is attached to the apparatus main body to be openable and closable,
wherein the cover comprises:
a lock member that is movable between a locking position where the lock member engages with the main body side engaging portion and an unlocking position where the lock member the main body side engaging portion;
a first biasing portion that biases the lock member toward the unlocking position;
a lever member that is provided to be in contact with the lock member, the lever member being movable between a retaining position for retaining the lock member at the locking position and a retention releasing position for releasing retention of the lock member in a direction intersecting with a moving direction of the lock member; and
a second biasing portion that biases the lever member toward the retaining position,
wherein: in a state in which the lever member is not pressed, the lever member is maintained at the retaining position under a biasing force of the second biasing portion, while the lock member is retained at the locking position against the biasing force of the first biasing portion, to thereby restrict opening of the cover with respect to the apparatus main body; and
when the lever member is pressed from an upper side to move the lever member from the retaining position to the retention releasing position against the biasing force of the second biasing portion, the lock member moves from the locking position to the unlocking position by the biasing force of the first biasing portion, to thereby allow opening of the cover with respect to the apparatus main body, wherein: a supporting member that supports the lever member is provided in the cover; a protruding portion that protrudes toward the lever member is provided on the supporting member; and an opening portion that increases in width upward and engages with the protruding portion is provided on the lever member.

6. An image forming apparatus comprising:

an apparatus main body that has an image forming unit and a main body side engaging portion; and a cover that is attached to the apparatus main body to be openable and closable, wherein the cover comprises:

a lock member that is movable between a locking position where the lock member engages with the main body side engaging portion and an unlocking position where the lock member the main body side engaging portion;

a first biasing portion that biases the lock member toward the unlocking position;

a lever member that is provided to be in contact with the lock member, the lever member being movable between a retaining position for retaining the lock member at the locking position and a retention releasing position for releasing retention of the lock member in a direction intersecting with a moving direction of the lock member; and a second biasing portion that biases the lever member toward the retaining position, wherein: in a state in which the lever member is not pressed, the lever member is maintained at the retaining position under a biasing force of the second biasing portion, while the lock member is retained at the locking position against the biasing force of the first biasing portion, to thereby restrict opening of the cover with respect to the apparatus main body; and when the lever member is pressed from an upper side to move the lever member from the retaining position to the retention releasing position against the biasing force of the second biasing portion, the lock member moves from the locking position to the unlocking position by the biasing force of the first biasing portion, to thereby allow opening of the cover with respect to the apparatus main body, wherein: a supporting member that supports the lever member is provided in the cover; a concave portion that increases in width downward is provided on the supporting member; and a protruding portion that protrudes toward the supporting member and engages with the concave portion is provided on the lever member.

* * * * *